(12) United States Patent
Cohen et al.

(10) Patent No.: US 7,136,304 B2
(45) Date of Patent: Nov. 14, 2006

(54) METHOD, SYSTEM AND CIRCUIT FOR PROGRAMMING A NON-VOLATILE MEMORY ARRAY

(75) Inventors: Guy Cohen, Yaad (IL); Boaz Eitan, Ra'anana (IL)

(73) Assignee: Saifun Semiconductor Ltd, Netanya (IL)

( * ) Notice: Subject to any disclaimer, the term of this patent is extended or adjusted under 35 U.S.C. 154(b) by 18 days.

(21) Appl. No.: 10/695,449

(22) Filed: Oct. 29, 2003

(65) Prior Publication Data

US 2005/0105337 A1 May 19, 2005

Related U.S. Application Data

(60) Provisional application No. 60/421,786, filed on Oct. 29, 2002.

(51) Int. Cl.
G11C 11/34 (2006.01)

(52) U.S. Cl. ............... 365/185.19; 365/185.24; 365/185.33

(58) Field of Classification Search ........... 365/185.24, 365/185.19, 185.33, 185.25, 185.28, 189.03, 365/189.19

See application file for complete search history.

(56) References Cited

U.S. PATENT DOCUMENTS

| | | | |
|---|---|---|---|
| 3,895,360 A | 7/1975 | Cricchi et al. | |
| 4,527,257 A | 7/1985 | Cricchi | |
| 4,725,984 A | 2/1988 | Ip et al. | |
| 4,761,764 A | 8/1988 | Watanabe | |
| 5,027,321 A | 6/1991 | Park | |
| 5,042,009 A | 8/1991 | Kazerounian et al. | |
| 5,172,338 A | 12/1992 | Mehrotra et al. | |
| 5,293,563 A | 3/1994 | Ohta et al. | |
| 5,295,108 A | 3/1994 | Higa | |
| 5,345,425 A | 9/1994 | Shikatani | |
| 5,349,221 A | 9/1994 | Shimoji | |
| 5,359,554 A | 10/1994 | Odake et al. | |
| 5,361,343 A | 11/1994 | Kosonocky et al. | |
| 5,418,743 A | 5/1995 | Tomioka et al. | |
| 5,422,844 A | 6/1995 | Wolstenholme et al. | |
| 5,424,978 A | 6/1995 | Wada et al. | |
| 5,434,825 A | 7/1995 | Harari | |
| 5,440,505 A | 8/1995 | Fazio et al. | |
| 5,450,341 A | 9/1995 | Sawada et al. | |
| 5,450,354 A | 9/1995 | Sawada et al. | |
| 5,521,870 A | 5/1996 | Ishikawa | |
| 5,523,972 A | 6/1996 | Rashid et al. | |
| 5,530,803 A | 6/1996 | Chang et al. | |

(Continued)

FOREIGN PATENT DOCUMENTS

EP 0 656 628 4/2003

(Continued)

OTHER PUBLICATIONS

U.S. Appl. No. 09/730,586, filed Dec. 7, 2000, Avni et al.

(Continued)

*Primary Examiner*—Richard Elms
*Assistant Examiner*—Dang Nguyen
(74) *Attorney, Agent, or Firm*—Eitan Law Group

(57) ABSTRACT

The present invention is a multi-phase method, circuit and system for programming non-volatile memory ("NVM") cells in an NVM array. The present invention may include a controller to determine when, during a first programming phase, one or more NVM cells of a first set of cells reaches or exceeds to first intermediate voltage, and to cause a charge pump circuit to apply to a terminal of the one or more cells in the first set second phase programming pulses to induce relatively greater threshold voltage changes in cells having less stored charge than in cells having relatively more stored charge.

17 Claims, 12 Drawing Sheets

U.S. PATENT DOCUMENTS

| | | | |
|---|---|---|---|
| 5,537,358 A | 7/1996 | Fong | |
| 5,563,823 A | 10/1996 | Yiu et al. | |
| 5,579,199 A | 11/1996 | Kawamura et al. | |
| 5,608,679 A * | 3/1997 | Mi et al. | 365/185.03 |
| 5,623,438 A | 4/1997 | Guritz et al. | |
| 5,644,531 A | 7/1997 | Kuo et al. | |
| 5,657,332 A | 8/1997 | Auclair et al. | |
| 5,677,869 A | 10/1997 | Fazio et al. | |
| 5,689,459 A | 11/1997 | Chang et al. | |
| 5,694,356 A | 12/1997 | Wong et al. | |
| 5,712,815 A | 1/1998 | Bill et al. | |
| 5,717,632 A | 2/1998 | Richart et al. | |
| 5,717,635 A | 2/1998 | Akatsu | |
| 5,748,534 A | 5/1998 | Dunlap et al. | |
| 5,751,637 A | 5/1998 | Chen et al. | |
| 5,768,193 A | 6/1998 | Lee et al. | |
| 5,774,395 A | 6/1998 | Richart et al. | |
| 5,787,036 A | 7/1998 | Okazawa | |
| 5,805,500 A | 9/1998 | Campardo et al. | |
| 5,812,449 A | 9/1998 | Song | |
| 5,812,457 A | 9/1998 | Arase | |
| 5,822,256 A | 10/1998 | Bauer et al. | |
| 5,870,334 A | 2/1999 | Hemink et al. | |
| 5,870,335 A | 2/1999 | Khan et al. | |
| 5,892,710 A | 4/1999 | Fazio et al. | |
| 5,926,409 A | 7/1999 | Engh et al. | |
| 5,946,258 A | 8/1999 | Evertt et al. | |
| 5,949,714 A | 9/1999 | Hemink et al. | |
| 5,969,993 A | 10/1999 | Takeshima | |
| 5,991,202 A | 11/1999 | Derhacobian et al. | |
| 5,999,444 A | 12/1999 | Fujiwara et al. | |
| 6,011,725 A | 1/2000 | Eitan | |
| 6,034,896 A | 3/2000 | Ranaweera et al. | |
| 6,064,591 A | 5/2000 | Takeuchi et al. | |
| 6,075,724 A | 6/2000 | Li et al. | |
| 6,078,518 A | 6/2000 | Chevallier | |
| 6,091,640 A | 7/2000 | Kawahara et al. | |
| 6,097,639 A | 8/2000 | Choi et al. | |
| 6,118,692 A | 9/2000 | Banks | |
| 6,147,904 A | 11/2000 | Liron | |
| 6,157,570 A | 12/2000 | Nachumovsky | |
| 6,169,691 B1 | 1/2001 | Pasotti et al. | |
| 6,181,605 B1 | 1/2001 | Hollmer et al. | |
| 6,192,445 B1 | 2/2001 | Rezvani | |
| 6,205,056 B1 | 3/2001 | Pan et al. | |
| 6,215,148 B1 | 4/2001 | Eitan | |
| 6,215,697 B1 | 4/2001 | Lu et al. | |
| 6,240,032 B1 | 5/2001 | Fukumoto | |
| 6,240,040 B1 | 5/2001 | Akaogi et al. | |
| 6,252,799 B1 | 6/2001 | Liu et al. | |
| 6,285,589 B1 | 9/2001 | Kajitani | |
| 6,292,394 B1 | 9/2001 | Cohen et al. | |
| 6,304,485 B1 | 10/2001 | Harari et al. | |
| 6,307,807 B1 | 10/2001 | Sakui et al. | |
| 6,320,786 B1 | 11/2001 | Chang et al. | |
| 6,324,094 B1 | 11/2001 | Chevallier | |
| 6,331,950 B1 | 12/2001 | Kuo et al. | |
| 6,353,554 B1 | 3/2002 | Banks | |
| 6,353,555 B1 * | 3/2002 | Jeong | 365/185.11 |
| 6,396,741 B1 | 5/2002 | Bloom et al. | |
| 6,438,031 B1 | 8/2002 | Fastow | |
| 6,442,074 B1 | 8/2002 | Hamilton et al. | |
| 6,456,528 B1 * | 9/2002 | Chen | 365/185.03 |
| 6,477,085 B1 | 11/2002 | Kuo | |
| 6,490,204 B1 | 12/2002 | Bloom et al. | |
| 6,519,180 B1 | 2/2003 | Tran et al. | |
| 6,519,182 B1 | 2/2003 | Derhacobian et al. | |
| 6,522,585 B1 | 2/2003 | Pasternak | |
| 6,552,387 B1 | 4/2003 | Eitan | |
| 6,567,303 B1 | 5/2003 | Hamilton et al. | |
| 6,567,312 B1 | 5/2003 | Torii et al. | |
| 6,577,532 B1 | 6/2003 | Chevallier | |
| 6,584,017 B1 | 6/2003 | Maayan et al. | |
| 6,590,811 B1 | 7/2003 | Hamilton et al. | |
| 6,618,290 B1 | 9/2003 | Wang et al. | |
| 6,636,440 B1 | 10/2003 | Maayan et al. | |
| 6,639,837 B1 | 10/2003 | Takano et al. | |
| 6,639,844 B1 | 10/2003 | Liu et al. | |
| 6,639,849 B1 | 10/2003 | Takahashi et al. | |
| 6,643,170 B1 | 11/2003 | Huang et al. | |
| 6,643,177 B1 | 11/2003 | Le et al. | |
| 6,665,769 B1 | 12/2003 | Cohen et al. | |
| 6,670,669 B1 | 12/2003 | Kawamura | |
| 6,690,602 B1 | 2/2004 | Le et al. | |
| 6,738,289 B1 * | 5/2004 | Gongwer et al. | 365/185.12 |
| 6,967,872 B1 * | 11/2005 | Quader et al. | 365/185.22 |
| 2001/0006477 A1 | 7/2001 | Banks | |
| 2002/0034097 A1 | 3/2002 | Banks | |
| 2002/0132436 A1 | 9/2002 | Eliyahu et al. | |
| 2002/0191444 A1 | 12/2002 | Gregori et al. | |
| 2002/0191465 A1 | 12/2002 | Maayan et al. | |
| 2003/0021155 A1 | 1/2003 | Yachareni et al. | |
| 2003/0028709 A1 * | 2/2003 | Micheloni et al. | 711/103 |
| 2003/0072192 A1 | 4/2003 | Bloom et al. | |
| 2003/0131186 A1 | 7/2003 | Buhr | |
| 2003/0142544 A1 | 7/2003 | Maayan et al. | |
| 2003/0156456 A1 | 8/2003 | Shappir et al. | |
| 2004/0008541 A1 | 1/2004 | Maayan et al. | |
| 2004/0151034 A1 | 8/2004 | Shor et al. | |
| 2004/0153621 A1 | 8/2004 | Polansky et al. | |
| 2005/0128810 A1 * | 6/2005 | Lutze et al. | 365/185.17 |

FOREIGN PATENT DOCUMENTS

| | | |
|---|---|---|
| JP | 07193151 | 7/1995 |
| JP | 408297988 | 11/1996 |
| JP | 09162314 | 6/1997 |
| JP | 10-106276 | 4/1998 |
| WO | WO 01/84552 | 11/2001 |
| WO | WO 03/063167 | 7/2003 |
| WO | WO 03/088259 | 10/2003 |
| WO | WO 03/088260 | 10/2003 |

OTHER PUBLICATIONS

Bude et al., "EEPROM/Flash Sub 3.0V drain—Source Bias Hot Carrier Writing", IEDM, 1995, pp. 989-992.

Bude et al., "Modeling Nonequilibrium Hot Carrier Device Effects", Conference of Insulator Specialists of Europe, Jun. 1997.

Ricco et al., "Nonvolatile Multilevel Memories for Digital Applications", Proceedings of the IEEE, Dec. 1998, pp. 2399-2421, vol. 86, No. 12, Institute of Electrical and Electronics Engineers, Inc.

* cited by examiner

METHOD, SYSTEM AND CIRCUIT FOR PROGRAMMING A NON-VOLATILE MEMORY ARRAY

CROSS-REFERENCE TO RELATED APPLICATIONS

The present application claims priority from U.S. provisional patent application Ser. No. 60/421,786, filed Oct. 29, 2002, which is hereby incorporated by reference in its entirety.

FIELD OF THE INVENTION

The present invention generally relates to the field of non-volatile memory ("NVM") cells. More specifically, the present invention relates to a system, circuit and method for programming one or more NVM cells using a multi-phase programming sequence or algorithm.

BACKGROUND OF THE INVENTION

Non-volatile memory ("NVM") cells are fabricated in a large variety of structures, including but not limited to Poly-silicon floating gate, as shown in FIG. 2A, and Nitride Read Only Memory ("NROM"), as shown in FIG. 2B. As is well known, an NVM cell's state may be defined and determined by its threshold voltage, the gate to source voltage at which the cell begins to significantly conduct current.

Different threshold voltage ranges are associated with different logical states, and a NVM cell's threshold voltage level may be correlated to the amount of charge (e.g. electrons) stored in a charge storage region of the cell. FIG. 1A shows a voltage distribution graph depicting possible threshold voltage distributions of a binary non-volatile memory cell, wherein vertical lines depict boundary voltage values correlated with each of the cell's possible states. Cells having Vt Lower than EV level are said to be erased verified. Cells having Vt Higher than PV are said to be program verified. These two limits define the completion of programming and erase sequences that may be performed on a cell. A Program sequence of programming pulses may be used to drive the Vt of a cell higher than PV, while an erase sequence may drive the cell's Vt lower than EV. Also visible in FIG. 1A are vertical lines designating a Read Verify (RV) level and an Intermediate Program Verify voltage, $PV^I$, designating the start of regions before the Program Verify threshold.

FIG. 1B shows a voltage distribution graph depicting possible threshold voltage distributions in the charge storage region of a multi-level non-volatile memory cell ("MLC"), wherein one set of vertical lines depict boundary values correlated with each of the cell's possible Program Verify Threshold Voltages (PV00, PV01, etc.), another set of vertical lines depict boundary values correlated with the Read Verify level of each of the cell's possible Program states (RV00, RV01, etc.), and yet another set depict boundary lines for Intermediate Program Verify voltages ($PV^I00$, $PV^I01$, etc.) associated with each of the states.

The amount of charge stored in a charge storage region of an NVM cell, may be increased by applying one or more programming pulses to the cell. While the amount of charge in the cell may decrease by applying an erase pulse to the NVM cell which may force the charge reduction in the cell's charge storage region, and consequently may decrease the NVM's threshold voltage.

A simple method used for operating NVM cells (e.g. programming, reading, and erasing) uses one or more reference structures such as reference cells to generate the reference levels (i.e. PVs, EVs). Each of the one or more reference structures may be compared against a memory cell being operated in order to determine a condition or state of the memory cell being operated. Generally, in order to determine whether an NVM cell is at a specific state, for example erased, programmed, or programmed at one of multiple possible program states within a multi-level cell ("MLC"), the cell's threshold level is compared to that of a reference structure whose threshold level is preset and known to be at a voltage level associated with the specific state being tested for. Comparing the threshold voltage of an NVM cell to that of a reference cell is often accomplished using a sense amplifier. Various techniques for comparing an NVM's threshold voltage against those of one or more reference cells, in order to determine the state(s) of the NVM's cells, are well known.

When programming an NVM cell to a desired state, a reference cell with a threshold voltage set at a voltage level defined as a "program verify" level for the given state may be compared to the threshold voltage of the cell being programmed in order to determine whether a charge storage area or region of the cell being programmed has been sufficiently charged so as to be considered "programmed" at the desired state. If after a programming pulse has been applied to a cell, it has been determined that a cell has not been sufficiently charged in order for its threshold voltage to be at or above a "program verify" level (i.e. the threshold voltage of the relevant reference cell) associated with the target program state, the cell is typically hit with another programming pulse to try to inject more charge into its charge storage region. Once a cell's threshold value reaches or exceeds the "program verify" level to which it is being programmed, no further programming pulse should be applied to the cell.

Groups of cells within an NVM array may be programmed concurrently. The group of NVM cells may consist of cells being programmed to the same logical state, or may consist of cells being programmed to several possible states, such as may be the case with MLC arrays. Since not all cells have the same susceptibility to being programmed, cells may not program at the same rate. Some cells may reach a target program state before other cells in the same set of cells that are being programmed together.

The need to increase NVM's performance dictates more aggressive programming algorithm using stronger programming pulses. The stronger pulses may cause the Vt of the NVM cell to change significantly hence increasing the variations in the response of the different cells to the programming algorithm. This is reflected in the programming tail that may become larger using more aggressive algorithms. Larger Programming tails may not be wanted since they reduce the endurance and retention figures of an NVM cell.

With MLC arrays the situation is finer. The voltage threshold boundaries which define a given logical state in an MLC cell (e.g. between two read levels) are usually considerably smaller than those for a binary NVM cell. FIG. 1B, to which reference is now made, illustrates four regions of an MLC, where each region is associated with one of the programmed states of the MLC. Because in an MLC a fixed range of potential threshold voltages (e.g. 3 Volts to 9 Volts) needs to be split into several sub-ranges or regions, the size of each sub-range or region in an MLC is usually smaller than a region of a binary NVM cell, as seen comparing FIG.

1A to 1B. Programming algorithms for MLC arrays may take into account that a programming tail should not exceed the read verify reference level above it.

The simple solution of reducing the steps of a programming algorithm to smaller and smaller steps does not assure the similar reduction of the PGM tail voltage distribution. This is due to practical limitations of array non uniformities in many parameters (e.g. physical dimensions, resistances of current paths, number of cells that need programming pulses simultaneously, etc. . . . ). Since cells are programmed in groups, the applied voltages experiences by each cell may different to some extent from the pulse voltage as supplied by power supplies.

There is a need in the field of semiconductors for improved systems, circuits and methods for the programming of NVM cells in a NVM array that has more control of the PGM rates hence the variations in the programming tail.

Algorithms for programming MLC cells are known. U.S. patent application Ser. No. 10/354,050, filed on Jan. 30, 2003, assigned to the same assignee as the present invention, teaches several programming algorithms for MLC memory arrays. The specification of U.S. patent application Ser. No. 10/354,050, is hereby incorporated by reference in its entirety into the present application.

SUMMARY OF THE INVENTION

The present invention is a method circuit and system for programming non-volatile memory ("NVM") cells in an NVM array. According to some embodiments of the present invention, one or more NVM cells of a memory array may be programmed using a controller or programming circuit adapted to provide a first programming phase and a second programming phase, wherein programming pulses associated with the second programming phase may induce lower programming rate, hence lower programming variations.

According to some embodiments of the present invention, one or more NVM cells of a memory array may be programmed using a controller or programming circuit adapted to provide a first programming phase and a second programming phase, wherein programming pulses associated with the second programming phase may induce relatively greater threshold voltage changes in cells having less stored charge than in cells having relatively more stored charge. According to some embodiments of the present invention, the second programming phase may induce relatively greater threshold voltage changes in cells having relatively lower threshold voltages after the first phase programming.

According to some embodiments of the present invention, a first set of NVM cells to be programmed to a first target threshold voltage level may receive first phase programming pulses until one or more of the cells in the first set reaches or exceeds a first intermediate threshold voltage level, after which the cells in the first set may receive second phase programming pulses until one or more, or substantially all, of the cells in the first set reach the first target threshold voltage.

According to some embodiments of the present invention, a second set of NVM cells to be programmed to a second target threshold voltage level may be programmed with first phase programming pulses whose initial voltage levels may correspond to initial voltage levels associated with the second phase programming of the first set of cells. The second set may receive first phase programming pulses until one or more of the cells in the second set reaches or exceeds a second intermediate threshold voltage level, after which the cells in the second set may receive second phase programming pulses until one or more, or substantially all, of the cells in the second set reach the second target threshold voltage.

According to some embodiments of the present invention, a third set of NVM cells may be programmed to a third target threshold voltage in a manner similar and corresponding to that describer for the first and second sets above. This process can be extended to arbitrary large number of sets of cells, associated an arbitrarily large number of target threshold voltages.

According to some embodiments of the present invention, first phase programming may be characterized by applying to a terminal of one or more NVM cells of a set of NVM cells incrementally increasing programming pulses in concert with pulses of substantially fixed voltage to a gate of the one or more NVM cells. According to some embodiments of the present invention, second phase programming may be characterized by applying to a terminal of one or more cell of the set programming pulses of substantially fixed voltage in concert with gate pulses of incrementally increasing voltage. According to an alternative embodiment of the present invention, second phase programming may be characterized by applying to a terminal of one or more cells programming pulses of incrementally increasing voltage in concert with gate pulses of a relatively reduced and substantially fixed voltage. According to some embodiments of the present invention, initial second phase gate and drain voltage levels may be deduced from a verify process of the cells during the first phase.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following non limiting detailed description when read with the accompanied drawings in which:

Figure 1A:
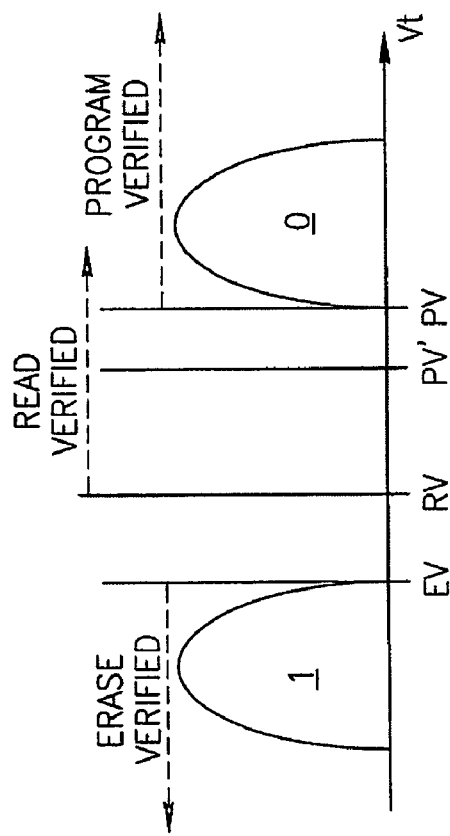
FIG. 1A shows a voltage distribution graph depicting possible threshold voltage distributions in the charge storage region of a binary non-volatile memory cell, wherein vertical lines depict boundary values or voltage threshold level correlated with the Program Verify, Read Verify and Intermediate Program Verify levels for each of the cell's possible program states.
Figure 1B:
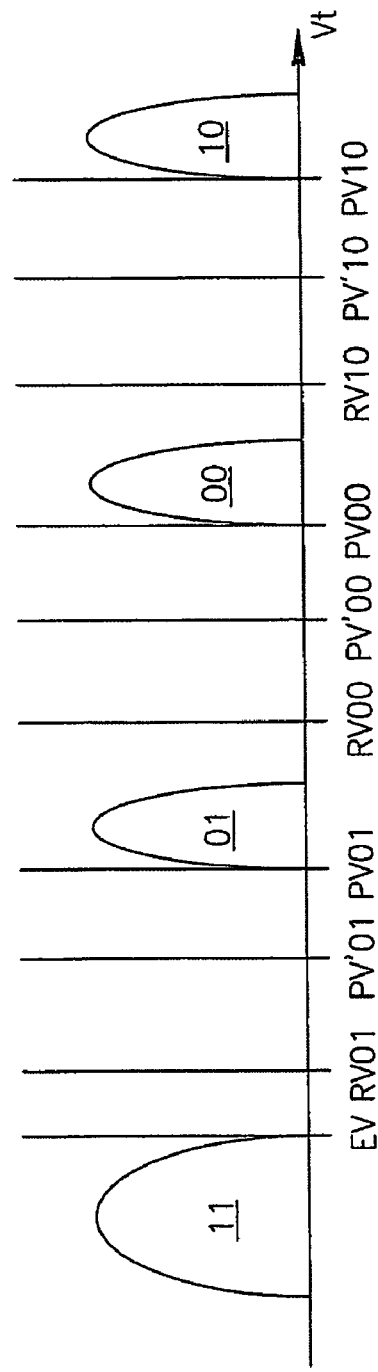
FIG. 1B shows a voltage distribution graph depicting possible threshold voltage distributions in the charge storage region of a multi-level non-volatile memory cell ("MLC"), wherein sets of vertical lines depict boundary values or voltage threshold levels correlated with the Program Verify, Read Verify and Intermediate Program Verify levels for each of the cell's possible states.
Figure 2A:
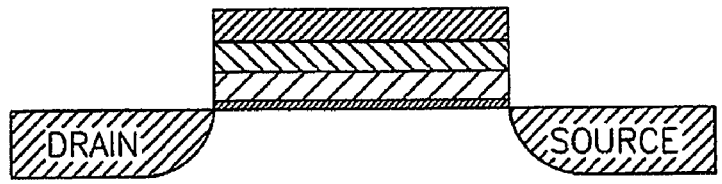
FIG. 2A shows a block diagram depicting a side cross sectional view of a floating gate memory cell.
Figure 2B:
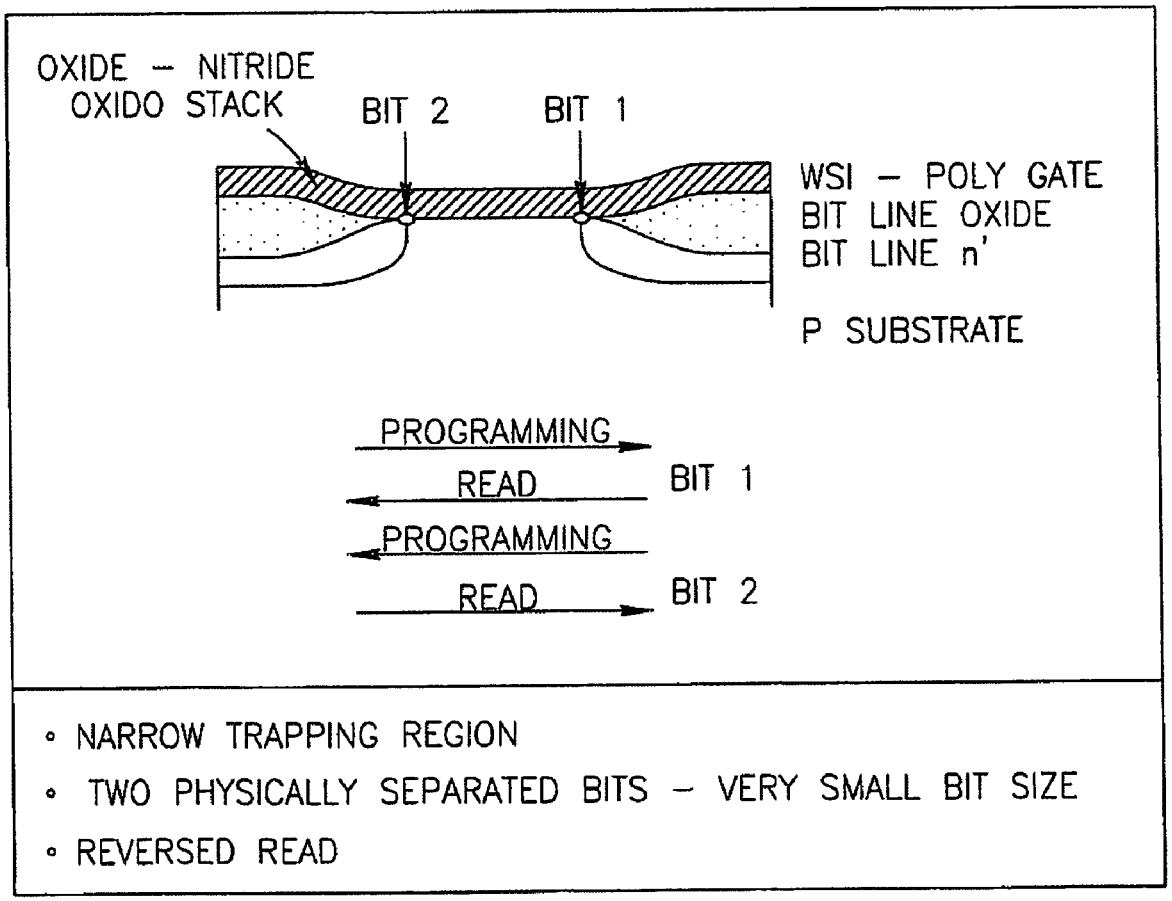
FIG. 2B shows a block diagram depicting a side cross sectional view of a Nitride Read Only Memory ("NROM") cell having to distinct programming charge storage regions.

It will be appreciated that for simplicity and clarity of these non-limiting illustrations, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However it will be understood by those of ordinary skill in the art that the present invention may be practiced without these specific details. In other instances, well-known methods and procedures have not been described in detail so as not to obscure the present invention.

The present invention is a method circuit and system for programming non-volatile memory ("NVM") cells in an NVM array. According to some embodiments of the present invention, one or more NVM cells of a memory array may be programmed using a controller or programming circuit adapted to provide a first programming phase and a second programming phase, wherein programming pulses associated with the second programming phase may induce relatively greater threshold voltage changes in cells having less stored charge than in cells having relatively more stored charge.

According to some embodiments of the present invention, a first set of NVM cells to be programmed to a first target threshold voltage level may receive first phase programming pulses until one or more of the cells in the first set reaches or exceeds a first intermediate threshold voltage level, after which the cells in the first set may receive second phase programming pulses until one or more, or substantially all, of the cells in the first set reach the first target threshold voltage.

According to some embodiments of the present invention, a second set of NVM cells to be programmed to a second target threshold voltage level may be programmed with first phase programming pulses whose initial voltage levels may correspond to initial voltage levels associated with the second phase programming of the first set of cells. The second set may receive first phase programming pulses until one or more of the cells in the second set reaches or exceeds a second intermediate threshold voltage level, after which the cells in the second set may receive second phase programming pulses until one or more, or substantially all, of the cells in the second set reach the second target threshold voltage.

According to some embodiments of the present invention, a third set of NVM cells may be programmed to a third target threshold voltage in a manner similar and corresponding to that describer for the first and second sets above. This process can continue to complete a large number of sets of cells to be programmed.

According to some embodiments of the present invention, first phase programming may be characterized by applying to a terminal of one or more NVM cells of a set of NVM cells incrementally increasing programming pulses in concert with pulses of substantially fixed voltage to a gate of the one or more NVM cells. According to some embodiments of the present invention, second phase programming may be characterized by applying to a terminal of one or more cell of the set programming pulses of substantially fixed voltage in concert with gate pulses of incrementally increasing voltage. According to an alternative embodiment of the present invention, second phase programming may be characterized by applying to a terminal of one or more cells programming pulses of incrementally increasing voltage in concert with gate pulses of a relatively reduced and substantially fixed voltage.

Figure 3:
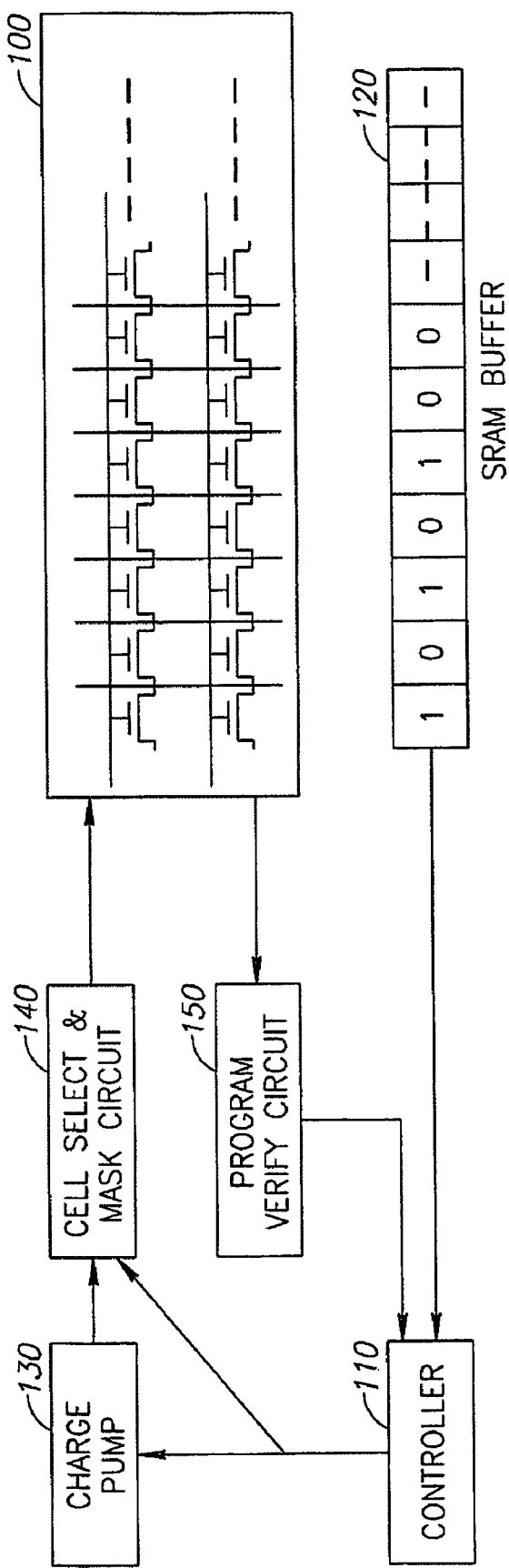
FIG. 3 shows a block diagram of controller and related circuits required for programming memory cells in an array of NVM cells.

Turning now to FIG. 3, there is shown a block diagram of a NVM cell array connected to controller 110 and to related circuits required for programming memory cells according to some embodiments of the present invention. The array 100 may be comprised of either single-storage-region NVM cells or multi-storage-region (e.g. dual bit) NVM cells. The controller 110 may be adapted to operate each charge storage region of each cell in the array 100 as either a dual level NVM cell or as a multi-level NVM cell. Furthermore, the array may be an array of multi-level cells in each of the above mentioned configurations.

Data to be stored on the NVM array 100 may be first received in a buffer 120 (e.g. Static Random Access Memory—SRAM) and may then be read by the controller 110, which may respond by instructing a charge pump circuit 130 to produce first and second phase programming pulses corresponding to the data to be stored. The controller 110 may determine to which set of NVM cells in the NVM array 100 to store the data and in what format (e.g. dual-level/binary-level, multi-level format) the data is to be stored on the selected set of cells. The controller 110 may instruct a cell selection and masking circuit 140 to provide the charge pump circuit 130 with access to the selected cells. A program verify circuit 150 may be used by the controller 110 to determine when a cell reaches or exceeds a given threshold voltage, for example, either the final target threshold voltage level associated with a logical state of a binary or MLC cell, or an intermediate threshold voltage associated with the above mentioned logical states.

Figure 4A:
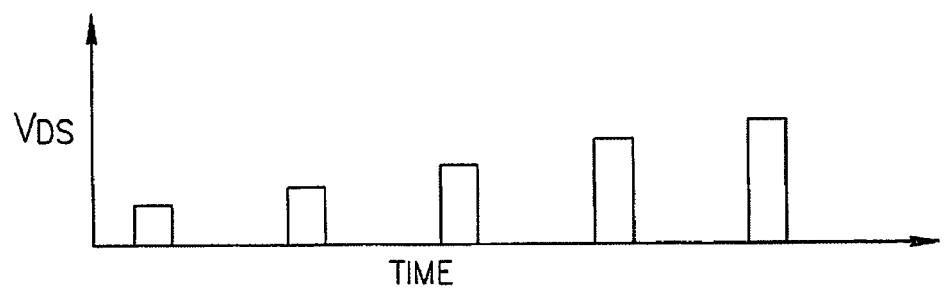
FIG. 4A shows a time domain voltage graph illustrating a possible arrangement of programming pulses (e.g. Vds) to be applied to a terminal of an NVM cell during a first programming phase according to some embodiments of the present invention.
Figure 4B:
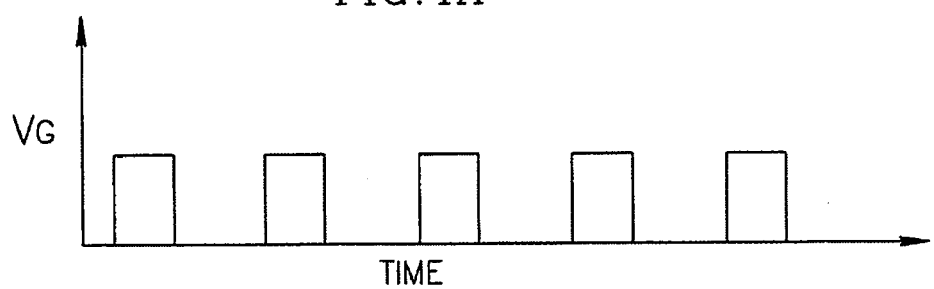
FIG. 4B shows a time domain voltage graph, substantially aligned with the graph of FIG. 4A, and illustrating a possible arrangement of first phase gate pulses (Vg) corresponding to first phase programming pulses according to some embodiments of the present invention.

Turning now to FIG. 4A, there is shown a time domain voltage graph illustrating a possible arrangement of programming pulses (e.g. Vds, etc.) to be applied to a terminal of an NVM cell during a first programming phase according to some embodiments of the present invention. While FIG. 4B shows a time domain voltage graph, substantially aligned with the graph of FIG. 4A, illustrating a possible arrangement of first phase gate pulses (Vg) corresponding to first phase programming pulses according to some embodiments of the present invention. As visible from the graphs, first phase programming pulses according to some embodiments of the present invention may be characterized by incrementally increasing programming pulses (e.g. Vsd) in concert with pulses of substantially fixed gate voltage (e.g. Vg=9.5 Volts). For clarity, the verify conditions of the terminals Vds and Vg are not shown though one must understand that they exists. Same holds for the exact time correlation between the rise and fall of the two set of pulses.

Figure 4C:
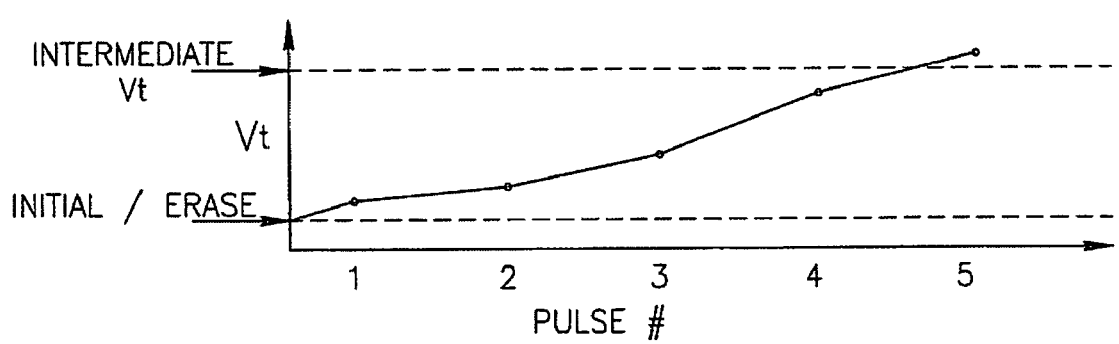
FIG. 4C shows a time domain graph, substantially time aligned with the graphs of FIGS. 4A and 4B, and illustrating a change in threshold voltage of a first NVM cell receiving the pulses (e.g. Vds and Vg) of FIGS. 4A and 4B.
Figure 4D:
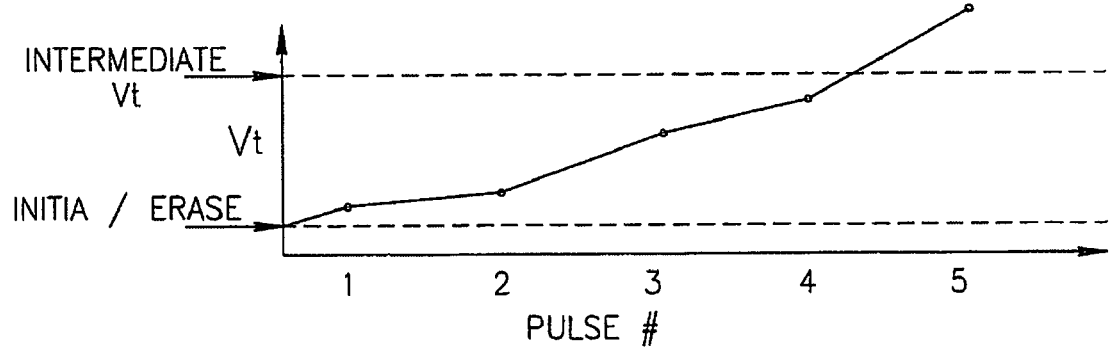
FIG. 4D shows a time domain graph, substantially time aligned with the graphs of FIGS. 4A and 4B, and illustrating a change in threshold voltage of a second NVM cell receiving the pulses of FIGS. 4A and 4B, thus illustrating the possible variance of responses between to cells to the same set of pulses.

Turning now to FIG. 4C, there is shown a time domain graph, substantially time aligned with the graphs of FIGS. 4A and 4B, and illustrating a change in threshold voltage of a first NVM cell receiving the pulses of FIGS. 4A and 4B. Similarly, FIG. 4D shows a time domain graph, substantially time aligned with the graphs of FIGS. 4A and 4B, and illustrating a change in threshold voltage of a second NVM cell receiving the pulses of FIGS. 4A and 4B. These graphs, and more specifically the difference between them, illustrates how differently two cells may respond to the same set of programming pulses. Therefore, according to some embodiments of the present invention, first phase programming pulses may be applied to a cell or group of cells until one or more of the cells reaches an intermediate threshold level, as shown in FIGS. 4A and 4B.

The actual threshold voltage defined as an "intermediate threshold voltage level" for a cell or set of cells depends on the program state to which the cell(s) is to be charged. For example, if the cell or set of cells is to be charged to first program state defined by a threshold voltage (program verify voltage) of 4.5 Volts, the target threshold voltage may be 4.5 Volts while the intermediate threshold voltage may be anywhere between 4.0 to 4.5 Volts. Likewise, if the cell or set of cells is to be charged to a second program state defined by a threshold voltage (program verify voltage) of 6 Volts, the target threshold voltage may be 6 Volts while the intermediate threshold voltage may be anywhere between 5.5 to 6 Volts.

Figure 5A:
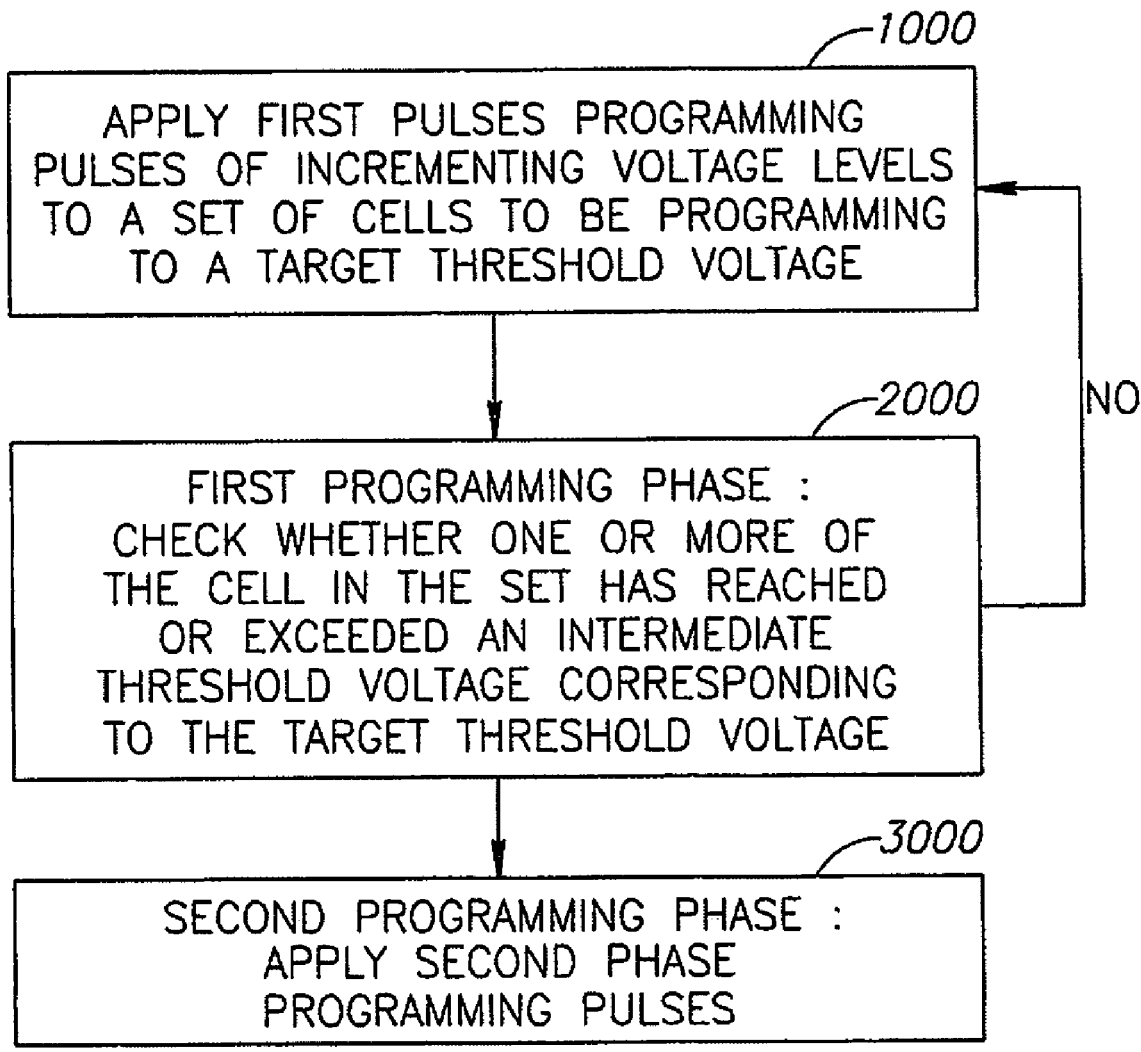
FIG. 5A shows a basic flow chart diagram depicting steps by which a set of NVM cells may be programmed to an intermediate and then a target threshold voltage as part of to a two phase programming method according to some embodiments of the present invention.

As visible from FIG. 5A, which shows a basic flow chart diagram depicting steps by which a set of NVM cells may be programmed to a target threshold voltage as part of to a two phase programming method according to some embodiments of the present invention, once one or more of the cells of the set have reached or exceeded an intermediate threshold voltage level corresponding to the target threshold voltage level to which the cells are being programmed, first phase programming pulses may be followed with second phase programming pulses. Second phase programming pulses according to some embodiments of the present invention may induce greater relative threshold voltage changes in cells having less stored charge (i.e. having a lower threshold voltage) than in cells having relatively more stored charge (i.e. having higher threshold voltage).

Figure 5B:
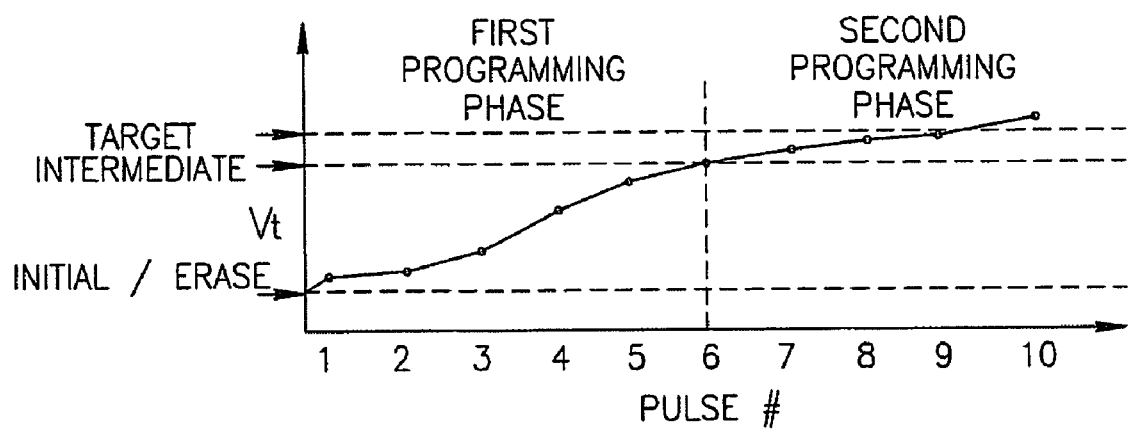
FIG. 5B is a graph illustrating a change in threshold voltage of a first NVM cell receiving programming pulses as part of the first and second programming phases of FIG. 5A.
Figure 5C:
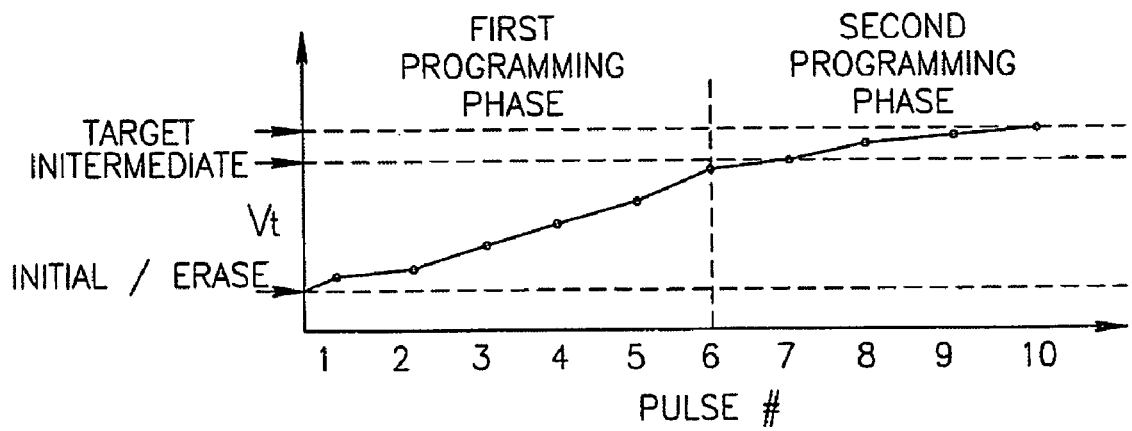
FIG. 5C is a graph illustrating a change in threshold voltage of a second NVM cell receiving programming pulses as part of the first and second programming phases of FIG. 5A, and which cell has relatively greater changes in Vt in response to second phase programming pulses than those the cell of FIG. 5B.

Turning now to FIG. 5B, there is shown a graph illustrating a change in threshold voltage of a first NVM cell receiving programming pulses as part of the first and second programming phases of the method shown in FIG. 5A, while FIG. 5C is a graph, time/pulse aligned with FIG. 5B, illustrating a change in threshold voltage of a second NVM cell receiving programming pulses as part of the first and second programming phases of the method shown in FIG. 5A. While the first cell shown in FIG. 5B may charge more quickly during the first phase of programming (i.e. absorb more charge in response to each programming pulse) than the second cell shown in FIG. 5C, according to some embodiments of the present invention, the second cell shown in FIG. 5C may charge more quickly during second phase programming than the first cell. That is, the second cell may absorb more charge in response to each programming pulse of the second phase than may the first cell. According to some embodiments of the present invention, the second phase programming pulses may be adapted to induce weaker vertical fields than those induced by first phase programming pulses, and thus the second phase programming pulses may induce greater relative charging in cells having less internally stored charge, which internally stored charge may act to cancel out portions of the induced vertical fields.

Figure 6A:
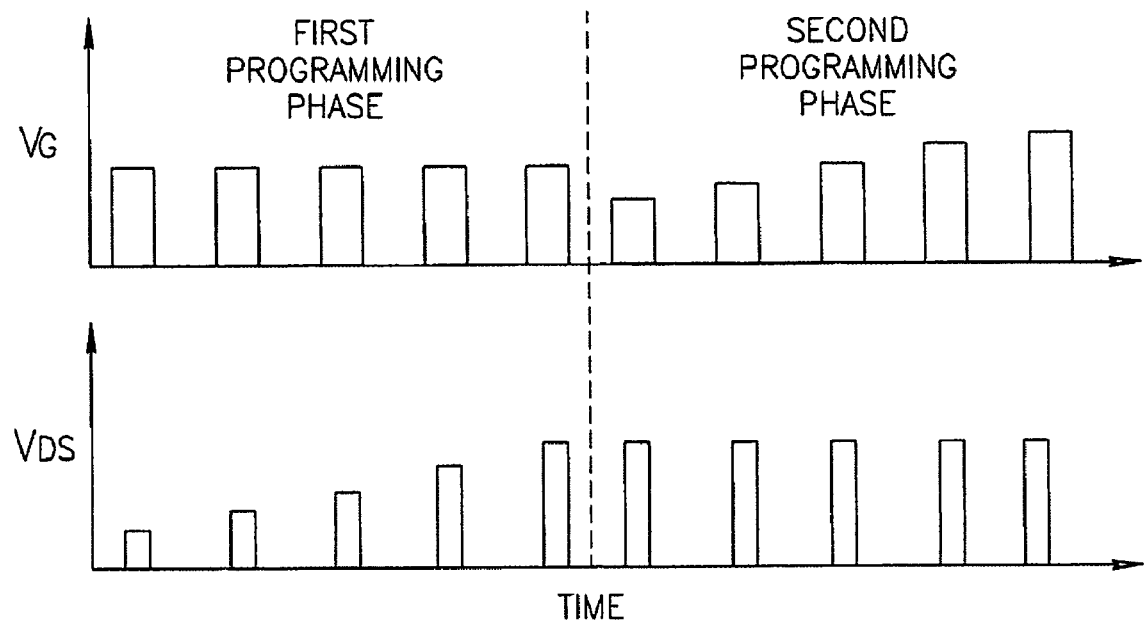
FIG. 6A shows two time aligned voltage graphs illustrating gate pulses (Vg) and programming pulses (Vds) to be applied to an NVM cell according to some embodiments of the present invention.

Turning now to FIG. 6A, there are shown two time aligned voltage graphs illustrating gate pulses (Vg) and programming pulses (Vds) to be applied to an NVM cell according to both phases of some embodiments of the present invention. During a first programming phase, one or more cells of a set of cells to be programmed to a target threshold voltage level may receive programming pulse (Vds) of incrementally increasing voltage in concert with pulses of substantially fixed voltage applied to gates of the one or more NVM cells. Once one or more cells in the set reaches or exceeds an intermediate voltage corresponding to the target threshold voltage for the set, second phase programming pulses of substantially fixed voltage may be applied in concert with gate pulses of incrementally increasing voltage. According to some embodiment of the present invention, the substantially fixed voltage of the programming pulses during the second phase may be at the same or related by a function to the voltage level as the last programming pulse applied during the first phase.

Figure 6B:
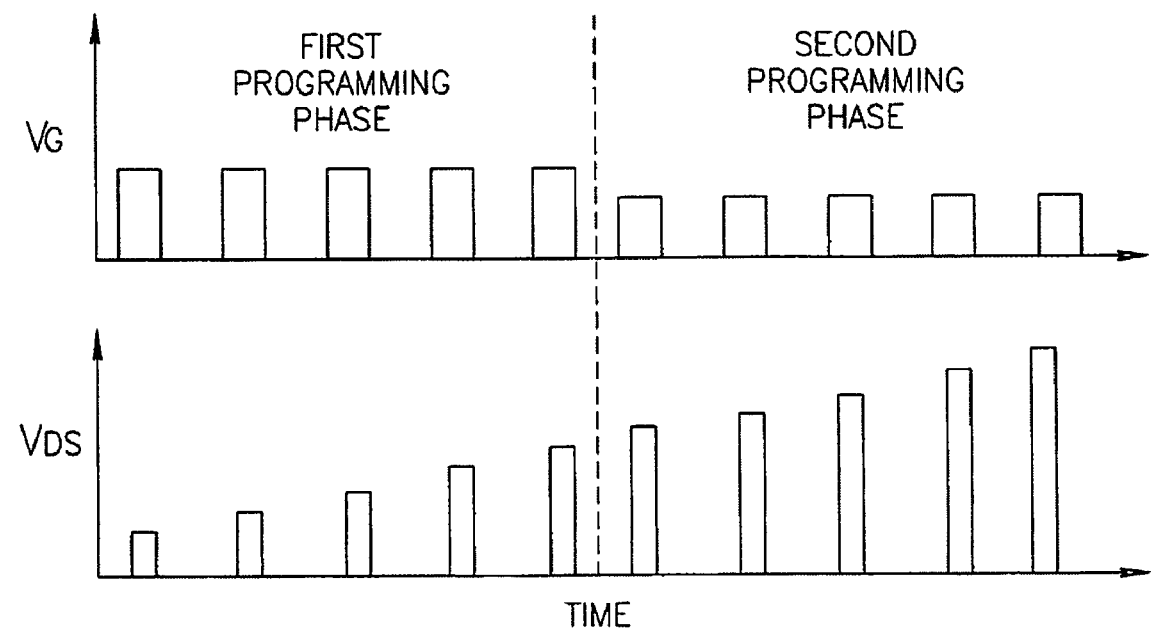
FIG. 6B shows two time aligned voltage graphs illustrating gate pulses (Vg) and programming pulses (Vds) to be applied to an NVM cell according further embodiments of the present invention.

Turning now to FIG. 6B, there are shown two time aligned voltage graphs illustrating gate pulses (Vg) and programming pulses (Vds) to be applied to an NVM cell according further embodiments of the present invention. The first phase programming pulses of FIG. 6B are substantially identical to those of FIG. 6A. However, the second phase programming pulses depicted in FIG. 6B show an alternate second phase programming approach, where the programming pulses (Vds) continue to be incremented, but only the voltage level of the gate pulses are reduced. Vg of the second phase may be correlated to Vg in the first phase while Vd increments can be changed between the first and second phases.

Figure 7:
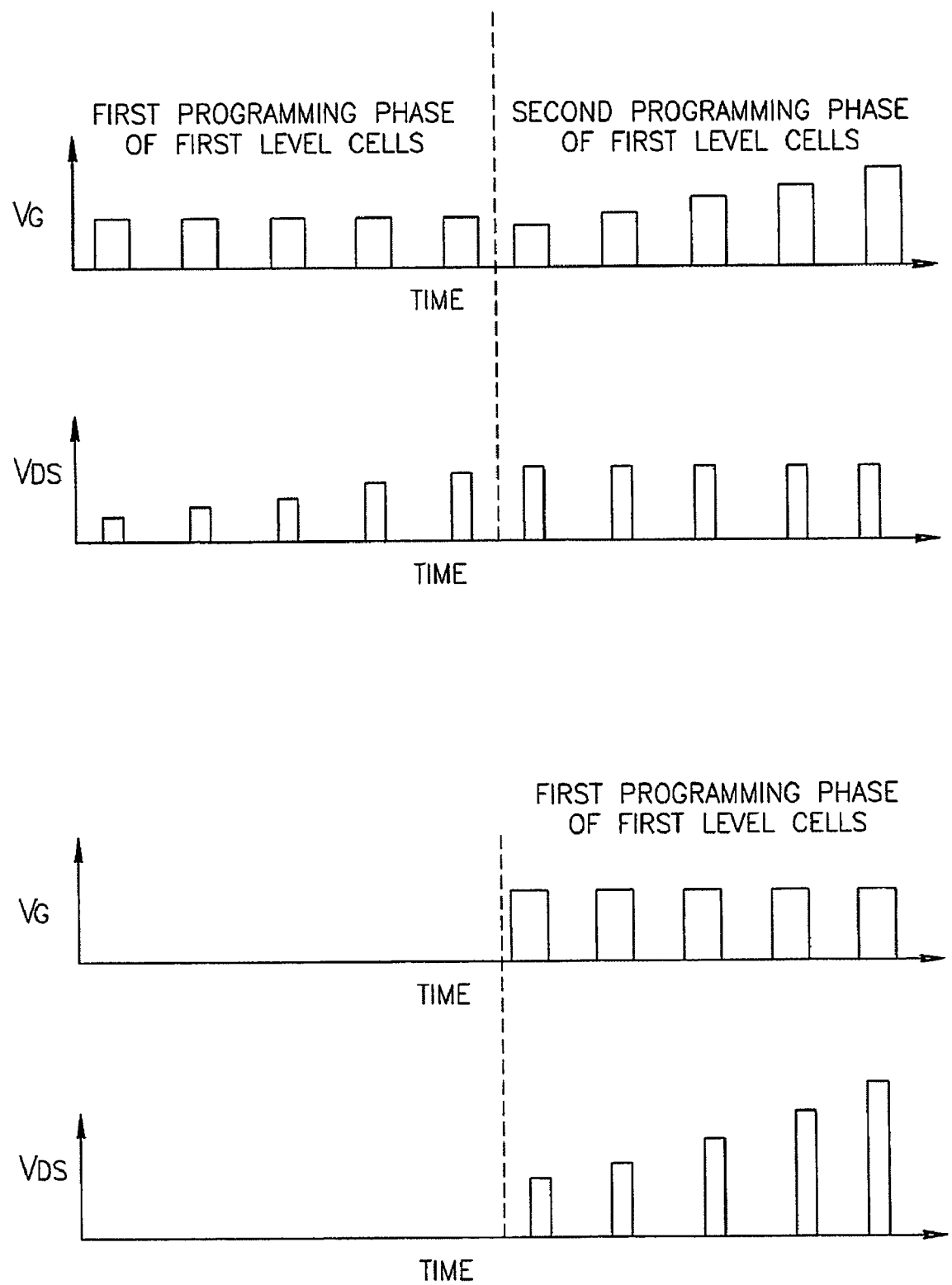
FIG. 7 shows two sets of time aligned voltage graphs, each set illustrating the gate pulses (Vg) and programming pulses (Vds) to be applied to an NVM cell according to some embodiments of the present invention, wherein the first set of graphs illustrates pulses to be applied to an NVM cell being programmed to a first target threshold voltage (i.e. a first program state) while the second set illustrates pulses to be applied to an NVM cell being programmed to a second intermediate threshold voltage, where the initial Vds and Vg of the second cell is related to the final Vds and Vg of the of the first cell.

According to some embodiments of the present invention, a first set of cells to be charged/programmed to a first target threshold voltage receive first phase programming pulses until one or more of the cells of the first set reach or exceed an first intermediate threshold voltage level correspond to the first target threshold voltage level. Once one or more cells of the first set reach to exceed the first intermediate threshold voltage level, some or all of the cells of the first set receive second phase programming pulses. According to further embodiments of the present invention, a second set of cells to be programmed to a second target threshold voltage level may receive first phase programming pulse, where the voltage level of the second set's programming first phase programming pulses are a function of the last programming pulse applied to the cells of the first set during first phase programming. Turning now to FIG. 7, there is shown two sets of time aligned voltage graphs, each set illustrating the gate pulses (Vg) and programming pulses (Vds) to be applied to an NVM cell according to some embodiments of the present invention, wherein the first set of graphs illustrates pulses to be applied to an NVM cell in a first set of cells and being programmed to a first target threshold voltage (i.e. a first program state), while the second set of graphs illustrates pulses to be applied to an NVM cell in a second set of cells and being programmed to a second target threshold voltage (i.e. a second program state). According to the embodiment of the present invention depicted in FIG. 7, the second cell in the second set may begin first phase programming after the first cell in the first set has completed its first phase programming, and the first programming pulse applied to the second set may be of substantially the same or less or greater voltage as the last programming pulse applied to the first cell during the first programming phase. The cell belonging to the second set may be programmed to a level close but not exactly to the intermediate level of the first set.

Figure 8:
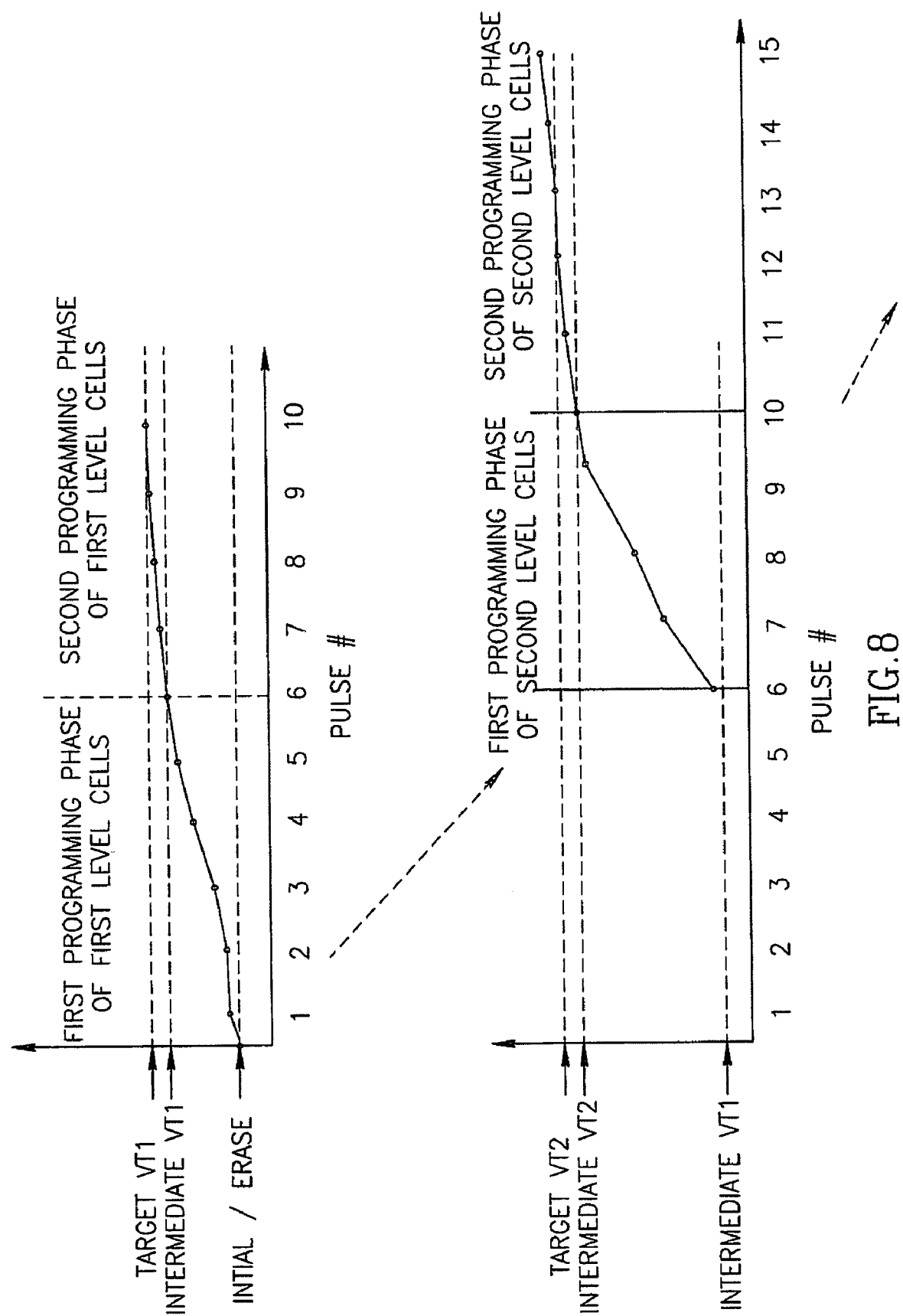
FIG. 8 shows first and second time aligned threshold voltage graphs depicting possible changes in the threshold voltages of a first and second NVM cell, where the first NVM cell was programmed with pulses depicted in the first set of graphs in FIG. 7 and the second NVM cell is programmed with pulses depicted in the second set of graphs in FIG. 7. The target threshold voltage for each cell is the program verify threshold voltage to which the cell is being programmed, and the intermediate threshold voltage may be, but does not have to be, the Read Verify threshold voltage associated to the given Program Verify threshold voltage.

Turning now to FIG. 8, there are shown first and second time aligned threshold voltage graphs depicting possible changes in the threshold voltages of a first and second NVM cell, where the first NVM cell was programmed with pulses depicted in the first set of graphs in FIG. 7 and the second NVM cell is programmed with pulses depicted in the second set of graphs in FIG. 7. As should be obvious to anyone of ordinary skill in the art the concepts and methods related to FIGS. 7 and 8, as they relate to the present invention are not limited to two sets of cells. According to some embodiments of the present invention, there may be a third set of cells to be programmed to a third target threshold voltage, fourth, and a fifth, etc., where the first phase programming pulses of each phase are at least partially a function of the last first phase programming pulse applied the previous set of cells.

Figure 9:
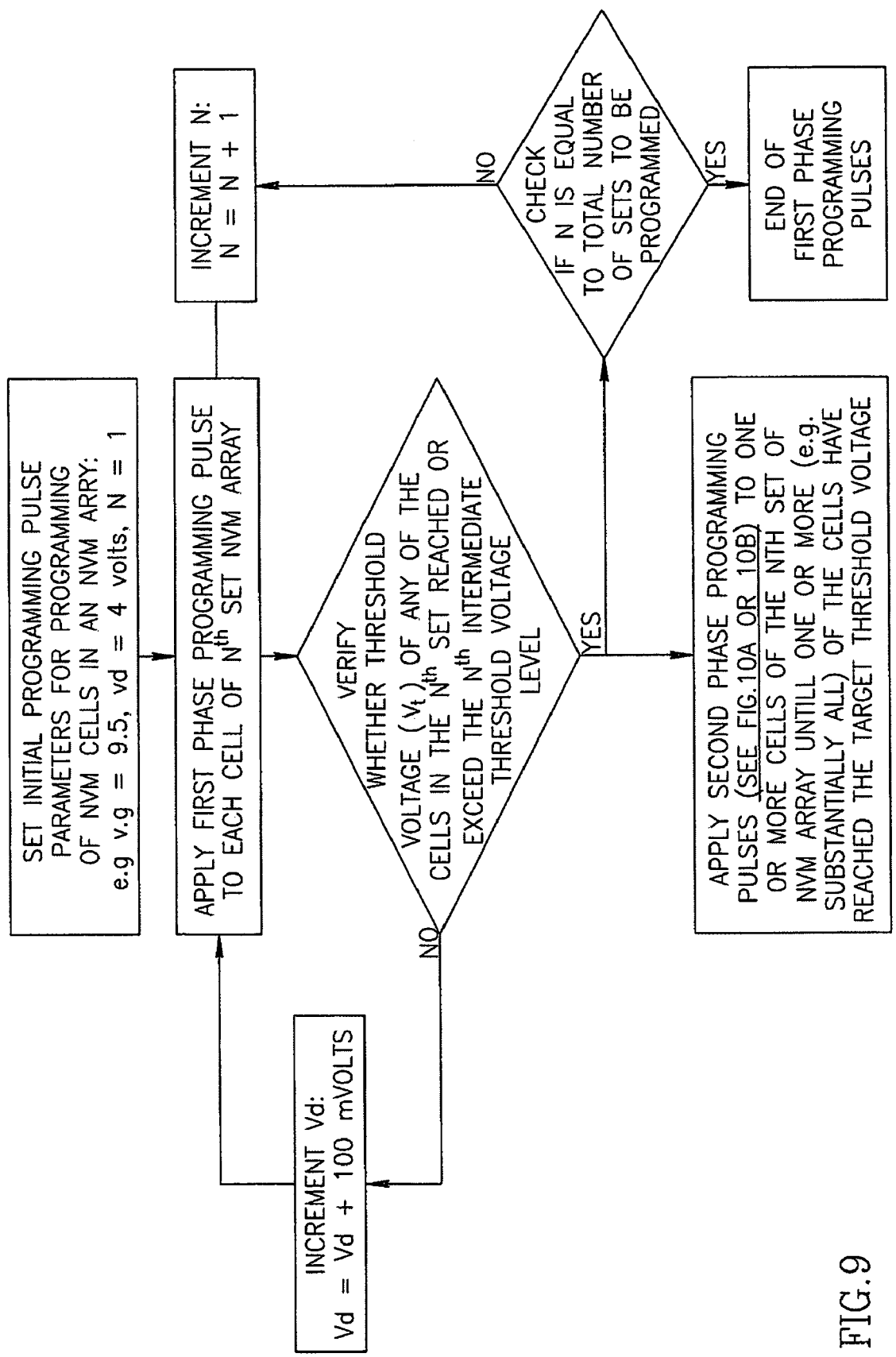
FIG. 9 is a flow chart illustrating steps of a first programming phase according to some embodiments of the present invention.

Turning now to FIG. 9, there is shown a flow chart illustrating the steps of a first programming phase according to some embodiments of the present invention. According to the exemplary embodiment of FIG. 9, initial voltage levels for first phase programming pulses to be applied to a first set of cell which are to be programming to a first intermediate threshold voltages may be set to Vg=9.5 and Vd=4 Volts. After each of the one or more cells from the first set receive a programming pulse, which pulse may be comprise of a Vd and Vg pulse as shown in FIGS. 4A & 4B, the c II's Vt may be checked to determine whether any of the cells have reached or exceeded the first intermediate threshold voltage. If none of the cells have reached the intermediate Vt, the Vd value may be incremented, for example by 100 mVolts, another programming pulse may be applied to the cells. This cycle may continue until one or more of the cells reaches the first intermediate Vt.

Once one or more of the cells of the first set reach the first intermediate Vt, the first set of cells may begin receiving second phase programming pulses, and a second set of cells may start receiving first phase programming pulses, where the initial Vd of the second set's first phase programming pulses may be related to the (e.g. substantially equal) to the find Vd applied to the first set during first phase programming. According to some embodiment of the present invention, the second set of cells may continue receiving programming pulses with an incrementing Vd until one or more cells in the second reach a second intermediate Vt. According to some embodiments of the present invention, there may be multiple intermediate and target threshold voltages, where each target threshold voltage is associated with a different logical state of an MLC array. Thus, there may be a third set, a fourth set, etc., where the voltage of the first phase programming pulses of each set of cells may be partially a function of the results of the programming of the previous set of cells.

Figure 10A:
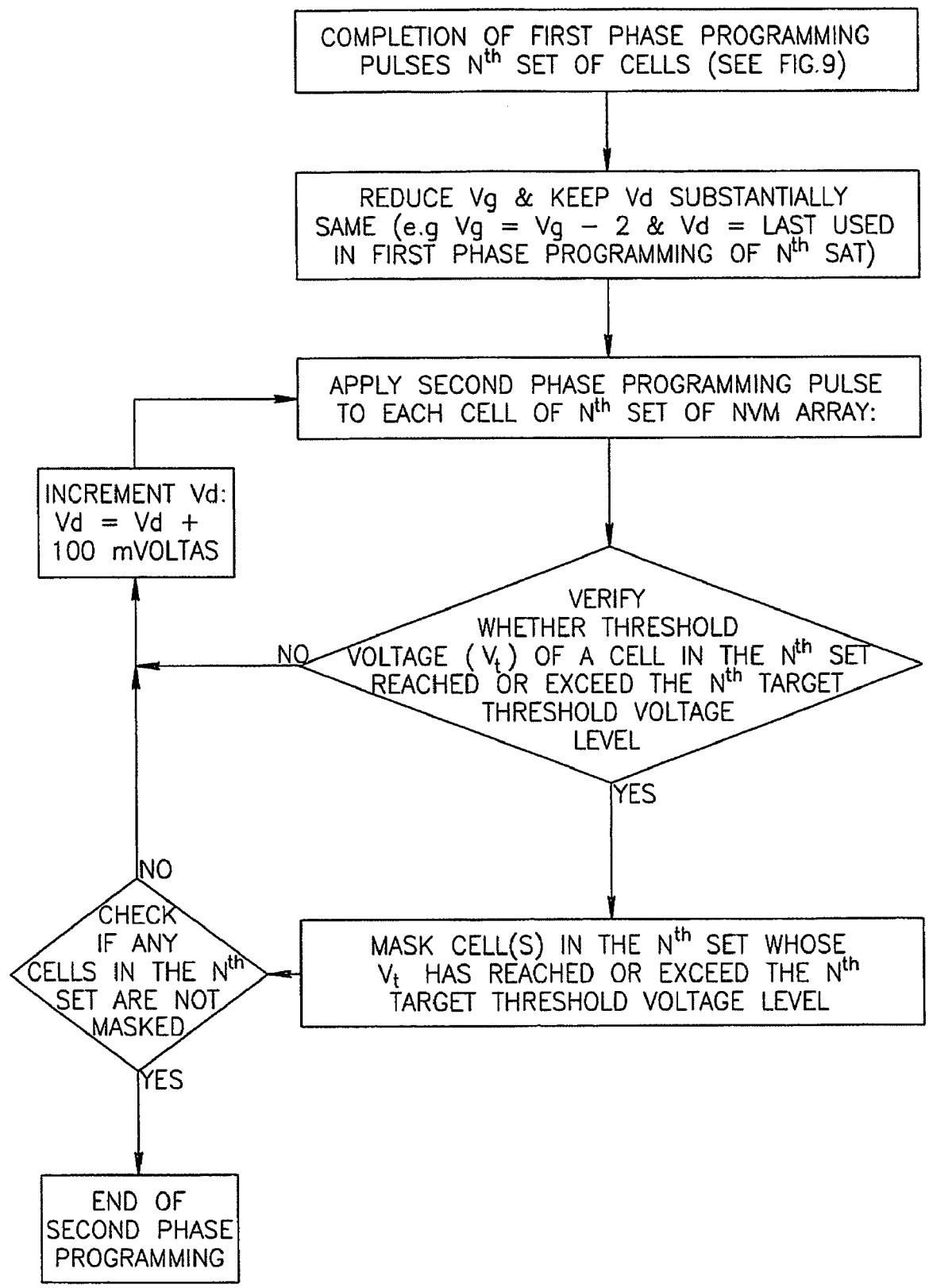
FIG. 10A is flow chart illustrating steps of a second programming phase according to some embodiments of the present invention.

FIG. 10A is flow chart illustrating steps of a second programming phase according to some embodiments of the present invention. After one or more cells of a set of cells has reached a given intermediate threshold voltage level (e.g. a first intermediate Vt), the set may receive second phase programming pulse so as to program the cells to the target threshold voltage level associated with the given intermediate level. According to the exemplary second phase programming algorithm of FIG. 10A, Vg may be reduced by several volts (e.g. Vg=Vg−2) and Vd may continue to be incremented or incremented at different incremental steps and applied to one or more cells of the set. (See FIG. 6B) until the desired target threshold voltage is reached. As each cell reaches the target Vt, it may be masked and may be blocked from receiving any more programming pulses. When all the cells have been masked, the second phase programming for the give set may terminate.

Figure 10B:
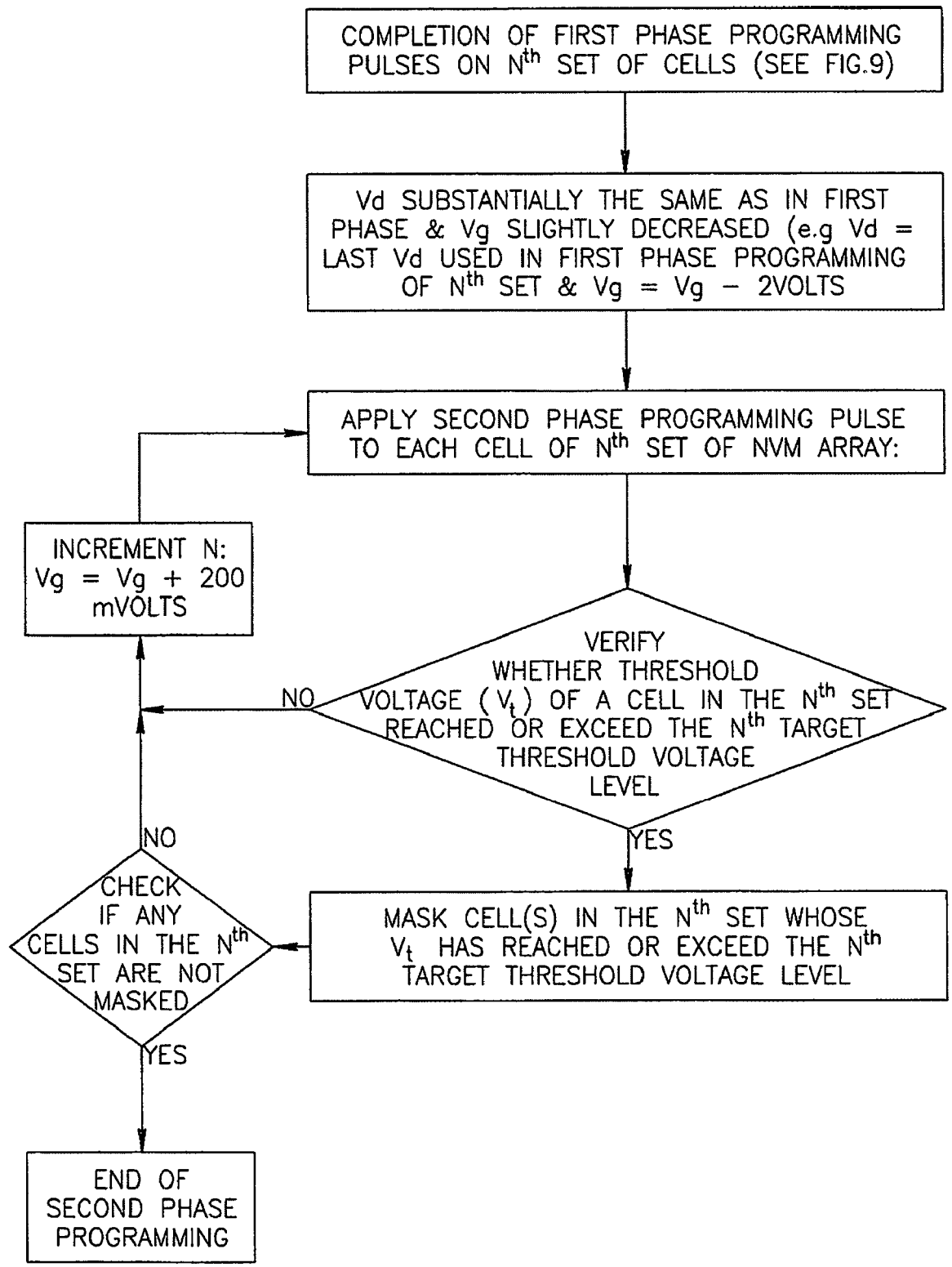
FIG. 10B is a flow chart illustrating steps of a second programming phase according to a further embodiment of the present invention.

Turning now to FIG. 10B, there is shown a flow chart illustrating steps of a second programming phase according to a further embodiment of the present invention. According to the algorithm embodied FIG. 10B, and as graphically depicted in FIG. 6A, Vd may be fixed at the last Vd applied to the set during first phase programming or Vd can be changed with respect to that voltage, and Vg is substantially reduced. Vg may then be incremented between pulse (e.g. Vg=Vg+200 mVolts) until the cells in the set have reached the relevant target threshold voltage level, after which second phase programming for that phase is terminated and second phase programming for a second set may begin.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A multi-phase method of programming an array of non-volatile memory ("NVM") cells, said method comprising:
   Applying to a first set of NVM cells first phase programming pulses; and
   upon one or more NVM cells of the first set of cells reaching or exceeding a first intermediate threshold voltage level, applying to a terminal of two or more cells in the first set of cells second phase programming pulses adapted to induce relatively greater threshold voltage changes in cells having less stored charge than in cells having relatively more stored charge.

2. The method according to claim 1, wherein applying first phase programming pulses to one or more NVM cells of the first set of cells comprises applying to a terminal of one or more NVM cells of the first set of NVM cells incrementally increasing programming pulses in concert with pulses of substantially fixed voltage applied to gates of the one or more NVM cells; and
   wherein applying second phase programming pulses, comprises applying to a terminal of the one or more cells programming pulses of substantially fixed voltage in concert with gate pulses of incrementally increasing voltage.

3. The method according to the claim 2, wherein applying to a terminals of the one or more cells of the first set second phase programming pulses of substantially fixed voltage in concert with gate pulses of incrementally increasing voltage is repeated until one or more of the cells of the first set reaches a first target threshold voltage level.

4. The method according to claim 3, wherein the second phase programming pulses of substantially fixed voltage are at a voltage corresponding to the voltage of the programming pulse which first succeeded in raising the threshold voltage of one or more cells of said first set to or beyond the first intermediate threshold voltage.

5. The method according to claim 3, wherein the initial value of the second phase gate pulses are at a voltage corresponding to the gate voltage of the programming pulse which first succeeded in raising the threshold voltage of one or more cells of said first set to or beyond the first intermediate threshold voltage.

6. The method according to claim 4, wherein the NVM cell is a multi-level cell.

7. The method according to claim 6, further comprising applying to a terminal of one or more NVM cells of a second set of NVM cells to be programmed to a second target threshold voltage first phase programming pulses of incrementally increasing voltage in concert with pulses of substantially fixed voltage applied to a gate of each of said NVM cells of said second set, wherein the first programming pulse applied to a terminal of the one or more NVM cells in the second set has a voltage corresponding to the voltage of the programming pulse which first succeeded in raising the threshold voltage of a cell in the first set to or beyond the first intermediate threshold voltage.

8. The method according to claim 7, further comprising upon one or more NVM cells of said second set reaching or exceeding a second intermediate threshold voltage, applying to a terminal of one or more cells of the second set second phase programming pulses of substantially fixed voltage in concert with gate pulses of incrementally increasing voltage.

9. The method according to claim 8, wherein applying to a terminal of one or more cells of said second set second phase programming pulses of substantially fixed voltage in concert with gate pulses of incrementally increasing voltage is repeated until said cell of said second set reaches the second target threshold voltage.

10. The method according to claim 1, wherein first phase programming comprises applying to a terminal of one or more NVM cells of a first set of NVM cells incrementally increasing programming pulses in concert with pulses of substantially fixed voltage applied to a gate of the one or more NVM cells; and
    wherein applying second phase programming pulses to one or more cells in the first set comprises applying to a terminal of the one or more cells programming pulses of incrementally increasing voltage in concert with gates pulses of a relatively reduced and substantially fixed voltage.

11. The method according to the claim 10, wherein applying to a terminal of one or more cells of a first set programming pulses of incrementally increasing voltage is repeated until all of the one or more cells of said first set reaches a first target threshold voltage.

12. The method according to claim 11, wherein the NVM cell is a multi-level cell.

13. The method according to claim 12, further comprising applying to a terminal of one or more NVM cells of a second set of NVM cells to be programmed to a second target threshold voltage first phase programming pulses of incrementally increasing voltage in concert with pulses of substantially fixed voltage applied to a gate one or more cells of the second set, wherein the first phase programming pulse applied to a terminal of the one or more NVM cells in the second set has a voltage corresponding to the voltage of the programming pulse which first succeeded in raising the threshold voltage of one or more cells in the first set to or beyond the first intermediate threshold voltage.

14. The method according to claim 1, wherein the NVM cell is selected from the group consisting of Nitride Read Only Memory ("NROM"), multi-level cell ("MLC"), dual charge trapping region NROM, and dual charge trapping region MLC NROM.

15. A System for programming an array of non-volatile memory ("NVM") cells, said system comprising:
    a controller adapted to cause a charge circuit to produce first phase programming pulses and to determine when one or more NVM cell of a first set of cells receiving the first phase programming pulses reaches or exceeds a first intermediate voltage, and to then cause said charge pump circuit to apply to a terminal the one or more cells in the first set second phase programming pulses adapted to induce relatively greater threshold voltage changes in cells having less stored charge than in cells having relatively more stored charge.

16. The system according to claim 15, wherein said controller is adapted to cause said charge pump circuit to initially apply to a terminal of one or more NVM cells of the first set of NVM cells first phase programming pulses having incrementally increasing voltage levels in concert with pulses of substantially fixed voltage applied to a gate of the one or more NVM cells, and once the threshold voltage of a one or more cells reaches or exceeds an intermediate threshold voltage level, said controller adapted to cause said charge pump circuit to apply to a terminal of one or more cells second phase programming pulses of substantially fixed voltage in concert with gate pulses of incrementally increasing voltage.

17. The system according to claim 16, wherein said controller is adapted to cause said charge pump circuit to initially apply to a terminal of one or more NVM cells of the first set of NVM cells first phase programming pulses of incrementally increasing voltage in concert with pulses of substantially fixed voltage applied to a gate of the one or more NVM cells, and once the threshold voltage of one or more cells reaches or exceeds an intermediate threshold voltage level said controller adapted to cause said charge pump circuit to apply to a terminal of one or more cells second phase programming pulses of incrementally increasing voltage in concert with gate pulses of substantially fixed and reduced voltage.

* * * * *